Aug. 17, 1971 J. BREEN 3,600,246

METHOD OF MAKING LAMINATED SEMICONDUCTOR DEVICES

Filed May 17, 1968

INVENTOR
Joseph Breen
BY M. Y. Epstein
ATTORNEY

United States Patent Office 3,600,246

Patented Aug. 17, 1971

3,600,246

METHOD OF MAKING LAMINATED SEMICONDUCTOR DEVICES

Joseph Breen, Somerville, N.J., assignor to RCA Corporation

Filed May 17, 1968, Ser. No. 730,045
Int. Cl. G01r *27/00*
U.S. Cl. 156—64 4 Claims

ABSTRACT OF THE DISCLOSURE

In the fabrication of semiconductor devices, a surface of a semiconductor wafer, containing a plurality of individual semiconductor components, is provided with a paste-like, viscous layer of a bonding cement, such as an epoxy resin. The paste-like material is rendered relatively hard and non-viscous, for the purpose of facilitating further handling of the wafer, and the wafer, after such further handling, is cracked to provide individual pellets, each having a surface of non-viscous bonding cement. The bonding cement is then resoftened to a paste-like, adhesive state, and the bonding cement layer is engaged with a support member to which the pellet is to be bonded. The assembly is heated to cure the bonding cement to form a rigid bond between the pellet and the support member.

BACKGROUND OF THE INVENTION

This invention relates to the fabrication of semiconductor devices, and particularly to the bonding of semiconductor pellets to support members, such as stem members.

In the assembly of certain types of semiconductor devices, e.g., transistors, integrated circuits, or the like, it is the practice to bond a semiconductor pellet to a support member such as the stem of a device enclosure, by means of a cement, such as an epoxy resin. The bonding cement can also serve as a means for conducting heat from the pellet, during operation of the device, and as an electrically conducting or insulating means for electrically contacting or isolating, respectively, the pellet to or from the support member.

The general practice has been to place a predetermined amount of epoxy resin paste on the support member, place the pellet on the resin, and heat the assembly to cure the resin to firmly bond the pellet in place.

One difficulty with the prior art practice is that it has not been known how to consistently provide the desired amount of resin on the support member. Too much resin, for example, often results in the resin flowing up the sides of the pellet and on to the upper surface thereof. The resin coating on the upper surface of the pellet interferes with the bonding of connector wires to the pellet, and in certain instances, can cause shorting together of the various elements on the surface of the pellet. Too little resin, on the other hand, causes improper mounting of the pellet on the support member with respect to the strength of the bond, the electrical connection to the pellet, and the heat sinking for the pellet.

SUMMARY OF THE INVENTION

A semiconductor wafer is coated with a layer of material which is non-viscous, and which can be converted to a viscous condition. The coated wafer is diced and the coatings on the individual dice are then converted to a viscous condition. The dice are then bonded to suitable substrates by means of the viscous layers thereon for the fabricating of semiconductor devices.

DESCRIPTION OF PREFERRED EMBODIMENTS OF THE INVENTION

Figure 1:
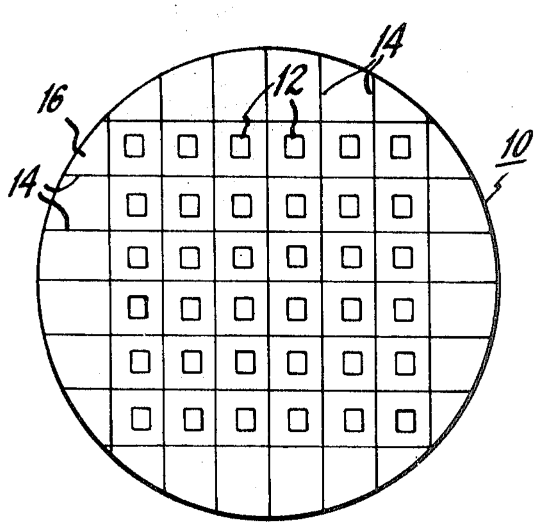
FIG. 1 is a plan view of a semiconductor wafer of known type.
Figure 2:
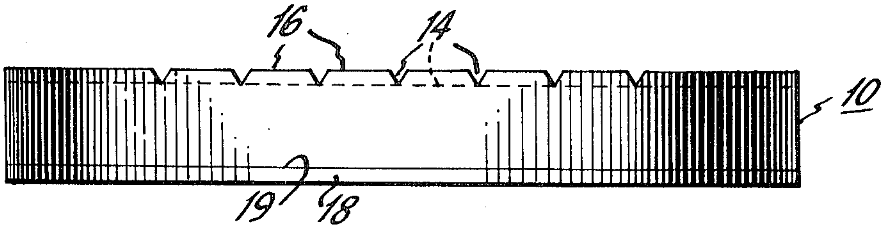
FIG. 2 is a side view of the wafer shown in FIG. 1.

The semiconductor wafer 10 shown in FIGS. 1 and 2 is a thin disc of a semiconductor material, such as silicon, containing a plurality of spaced and separate semiconductor components 12 arranged in orthogonal rows and columns. Examples of the details of various semiconductor components 12 are not given, since such components are well known. Although not shown, the components 12 are usually provided with contacts on the "top" surface 16 of the wafer 10.

The wafer 10 can be prepared using known processes including various photolithographic, impurity diffusion, and metallization steps. According to the usual practice, the wafer is provided with a plurality of orthoganal scribed lines 14 along which the wafer 10 is eventually cracked to separate the various components 12 into individual pellets.

Prior to the cracking of the wafer, the usual practice is to engage contacts of each component 12 with a probing mechanism for the purpose of testing and marking the components for segregation after the wafer cracking operation.

At some point in the preparation of the wafer 10, in accordance with the present method, one surface of the wafer is coated with a layer 18 of bonding cement. In the instant embodiment, wherein the wafer 10 has contacts on the top surface 16, the bonding cement is applied onto the bottom surface 19 of the wafer. The point in the wafer processing schedule at which the bonding layer 18 is applied to the wafer is not critical.

In one embodiment, for example, the layer 18 is applied to the wafer 10 after the fabrication of the individual components 12 on the wafer has been completed, but prior to the scribing of the wafer and the testing of the components. An advantage of this is that the layer 18, which is subsequently rendered relatively hard, as described hereinafter, contributes strength to the wafer 10, thereby reducing loss of product owing to wafer breakage.

In general, while not being limited thereto, the bonding cement can comprise any of a number of known thermosetting resin capable of being convertible from a viscous state to a non-tacky, relatively firm state, and back to the viscous state. Some known bonding cements, for example, such as one including the Shell Co. "Epon 828" epoxy resin and metaphenylene diamine, are viscous fluids which are capable of being "B staged," i.e., brought to a non-tacky, relatively firm, but uncured state, by the application of heat. The cooled, non-tacky cement can be reconverted to a viscous state by a subsequent heating step, which, if continued long enough, causes curing of the cement.

Other known bonding cements, for example, such as the Du Pont Company's Silver Composition #5504A cement, include a thinner or solvent to provide the desired viscous consistency, and can be reversibly converted to a non-tacky, relatively firm state by evaporating at least part of the thinner. Curing is also achieved by a heat treatment.

The method of applying the layer 18 to the wafer 10 is not critical, and various known means for applying the various suitable bonding materials to a surface can be used.

A suitable method, for example, is by "silk" screening. Using the aforementioned Du Pont Company's 5504A cement, for example, a 2 mil thick layer 18 of the cement is applied to the surface 19 of the wafer, using a 180 to 230 mesh stainless steel screen. Thicker or thinner layers 18 are applied using courser or thinner screen meshes, respectively.

Another method of applying the layer 18 is to spread it on the wafer, by means of a spatula, or the like, and to doctor blade the layer 18 to the desired thickness.

In the usual instance, the bonding material, when first applied to the surface 19 of the wafer 10, has a viscous, paste-like consistency. Such consistency facilitates application of the cement to the wafer. However, to facilitate further handling of the wafer, e.g., scribing and testing thereof, or simply storage of the wafer, without the wafer sticking to the various operating and handling means, the sticky paste-like layer 18 is converted to a relatively firm and non-viscous state.

In the case of the aforementioned Du Pont 5504A cement, for example, the layer 18 is rendered adequately firm and non-sticky, so as not to stick to objects coming in contact therewith, and not to rub off the wafer, by heating the wafer at a temperature of around 65° C., for a period of about one hour, in a circulating air oven.

If further processing of the wafer is not to be performed immediately, the wafer 10 can be stored at room temperature in a clean, air tight container.

Figure 3:
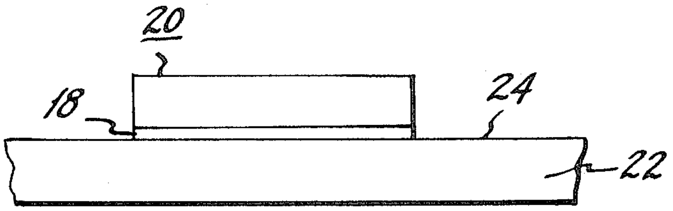
FIG. 3 is a side view, on an enlarged scale and partly broken away, showing the mounting of a semiconductor pellet, fabricated in accordance with the present invention, on a pellet support member.

The wafer 10 is eventually thereafter cracked apart, by known means, into individual pellets 20 (FIG. 3), each having a firm and non-viscous bonding material layer 18.

To mount the pellets 20 onto a support member 22, e.g., a stem member having leads (not shown) extending therethrough, and having a surface 24 of, e.g., nickel coated steel, on which the pellet 20 is to be mounted, the layer 18 is processed to reconvert the cement to an adhesive state. In the case of the aforementioned Du Pont 5504A cement, for example, this is accomplished by re-adding the solvent previously removed from the cement. The solvent, in the instant example, is butyl "Cellosolve" acetate, the word "Cellosolve" being a trademark of Union Carbide Corp. for this solvent.

A convenient means of re-applying the solvent to the cement layer 18 is by applying the solvent onto the support member surface 24, as by means of a solvent soaked wick, placing the pellet in the film of solvent, and gently scrubbing the pellet against the solvent wetted portion of the surface 24. The wetted layer 18 becomes adhesive again, and the pellet adheres to the support member 22.

To permanently bond the pellet in place, the assembly is heated to cure the bonding cement. In the case of the aforementioned Du Pont 5504A cement, curing comprises heating the epoxy for approximately 1 hour at a temperature of 200° C., in air.

The provision of a layer 18 of bonding cement on a surface of the wafer 10, before cracking thereof, as described, results in the presence of a highly uniform amount of bonding material in the pellet bonds, from pellet to pellet. This results in the semiconductor devices having more uniform characteristics, and significantly reduces the loss of product resulting from either excessive or insufficient amounts of bonding cement in the bonds.

Wafers 10, prepared as described, with the Du Pont 5504A cement, for example, have been stored for periods as long as 30 days without loss of the ability of the layers 18 to be reconverted to an adhesive state.

What is claimed is:

1. A method of fabricating a semiconductor device comprising:
- providing on a semiconductor wafer a layer of non-viscous bonding material which can be converted to a viscous condition,
- separating said wafer into a plurality of individual pellets each having a portion of said layer adherent to a surface thereof,
- converting the layers on said pellets to a viscous condition, and
- bonding said pellets to support members by means of the viscous layers on said pellets.

2. The method as in claim 1 wherein said material providing step comprises:
- applying a layer of viscous bonding material to one surface of said wafer, and
- rendering said layer firm and non-viscous.

3. The method as in claim 2 wherein said viscous bonding material application step comprises applying a layer of epoxy resin containing a solvent to said surface,
- said rendering step comprises evaporating at least part of said solvent from said resin, and
- said converting step comprises applying a solvent to said cement.

4. The method as in claim 2 including the steps of:
- scribing grooves into said wafer along which said wafer is later cracked, said grooves partitioning said wafer into separate components, and
- contacting portions of said components for testing the electrical characteristics thereof,
- said scribing and contacting steps being performed subsequent to said step of rendering said cement layer firm and non-viscous and prior to said wafer separating step.

References Cited

UNITED STATES PATENTS

| | | | |
|---|---|---|---|
| 2,908,049 | 10/1959 | Gold | 156—299X |
| 2,949,689 | 8/1960 | Vida | 156—299 |
| 2,980,566 | 4/1961 | Wohlfahrt et al. | 156—299X |
| 3,348,990 | 10/1967 | Zimmerman et al. | 156—297X |

BENJAMIN R. PADGETT, Primary Examiner

S. J. LECHERT, Jr., Assistant Examiner

U.S. Cl. X.R.

156—257, 265, 299, 330, 331